(12) United States Patent
Fei

(10) Patent No.: US 7,303,640 B2
(45) Date of Patent: Dec. 4, 2007

(54) ORIENTATION EQUIPMENT WITH MULTIPLE PCBS

(75) Inventor: Yao-Chi Fei, Tao-Yuan Hsien (TW)

(73) Assignee: D-Tek Technology Co., Ltd., Tao-Yuan Hsien (TW)

( * ) Notice: Subject to any disclaimer, the term of this patent is extended or adjusted under 35 U.S.C. 154(b) by 311 days.

(21) Appl. No.: 11/076,976

(22) Filed: Mar. 11, 2005

(65) Prior Publication Data

US 2005/0233607 A1    Oct. 20, 2005

(30) Foreign Application Priority Data

Apr. 2, 2004    (TW)    .............. 93205109 U

(51) Int. Cl.
  *B29C 65/00*    (2006.01)
  *B32B 37/00*    (2006.01)
  *H01R 12/00*    (2006.01)

(52) U.S. Cl. .......................... 156/64; 439/65

(58) Field of Classification Search ............... 439/65, 439/940; 29/603.04, 831, 742; 348/87, 348/95; 156/64; 228/103, 105, 114.5, 6.1, 228/9, 180.22

See application file for complete search history.

(56) References Cited

U.S. PATENT DOCUMENTS

| | | | | |
|---|---|---|---|---|
| 4,853,968 A | * | 8/1989 | Berkin | ................ 382/151 |
| 5,044,072 A | * | 9/1991 | Blais et al. | ................ 29/834 |
| 5,201,451 A | * | 4/1993 | Desai et al. | ................ 228/5.5 |
| 5,667,129 A | * | 9/1997 | Morita et al. | ................ 228/102 |
| 6,015,079 A | * | 1/2000 | Fogal et al. | ................ 228/4.1 |
| 6,537,400 B1 | * | 3/2003 | Fogal et al. | ................ 156/64 |
| 6,773,523 B2 | * | 8/2004 | Fogal et al. | ................ 156/64 |
| 6,793,749 B2 | * | 9/2004 | Fogal et al. | ................ 156/64 |
| 2004/0027456 A1 | * | 2/2004 | Pierce | ................ 348/175 |

* cited by examiner

*Primary Examiner*—Chandrika Prasad
(74) *Attorney, Agent, or Firm*—Rosenberg, Klein & Lee

(57) ABSTRACT

An orientation equipment with multiple PCBs adapted for a SMT line has a rack module including a casing mounting a front of the SMT line; a visual orientation module having a visual orientation camera used for recognizing the PCB; a movable arm module capable of lateral/longitudinal, upward/downward, and partial rotational movement; an inhalation module arranged on the movable arm module with a planar inhaling plate; and a conveyer module including a conveyer belt with an input, an output, an orientation side and an adjustment side. The movable arm module can carry plural PCBs for orientation on a carrier. The PCBs are transferred in from a first side of the conveyer module and the carrier is transferred in from a second side of the conveyer module. The visual orientation module, the movable arm module, the inhalation module and the conveyer module mechanically connect to the rack module directly or indirectly.

20 Claims, 6 Drawing Sheets

ORIENTATION EQUIPMENT WITH MULTIPLE PCBS

BACKGROUND OF THE INVENTION

1. Field of the Invention

The present invention relates to an orientation equipment in a surface mount technology (SMT), and particularly relates to an orientation equipment with multiple PCBs, used with surface mount technology (SMT).

2. Description of Related Art

As a common sense in the relative electronic industries, a mass production capacity of a SMT line is a topic for each PCB manufacturer and ODM. For example, a high-speed feeder, adjustable ability among different production lines, frequency of a revenue maintenance, or an improvement of the PCB processing, could ameliorate the mass production capacity in the SMT line to save cost and time. These reasons are of interest because the high-speed feeder can prevent wastes of time from a plurality of minor components arranged on the PCB. If the frequency of the revenue maintenance of the equipment can be prolonged due to the improvement of the mechanical function, the mass production capacity is increased and costs are reduced. As far as the equipment is concerned, a process improvement is a major undertaking; the SMT equipment is so precise that any change is expensive. An improvement of a periphery process adopted for the SMT equipment is cheaper and more effective.

A need for the periphery improvement of a conventional assembly of a PCB with double side arrangements, like a PCB in a cell phone, a digital camera, a laptop, a video card or a sound card, is increasing. The double-sided PCB needs more components and steps, and the characteristic of the equipment and the cost of the labor are the top improvements nowadays.

First, with respect to FIG. 1, a conventional PCB assembly line shows a double-sided PCB that may have different arrangements on the double sides thereof. A SMT process includes a first solder printing machine, top surface SMT equipment, a multi-function machine with the top surface SMT, a first reflow oven, a side-turning machine, a second solder printing machine, a reverse side surface SMT equipment and a second reflow oven, in sequence. The time of before the PCB is processed with the side-turning machine is different from that of after the PCB is processed with the side-turning machine, which makes the process influent. An IC that belongs to large components usually is disposed on a top side of the PCB and a large quantity of small components often is disposed on the reverse side of the PCB. The conventional SMT line is difficult to change to comply with the various products.

Second, a SMT line is a visual position and continues production line and losses of visual recognitions and intermediate station exchanges are inevitable. If quantities of PCBs can be in contact with a carrier, the frequency of the visual recognitions and intermediate station exchanges may be diminished to merely one time. A labor can be saved and manufacturing efficiency can be increased.

Third, the SMT equipment alternates the programs according to various PCBs, which wastes time and may involve errors. If quantities of PCBs can be in contact with a carrier as a big size PCB with only one specific program, the frequency of program changes may be diminished to save labor, and the manufacture efficiency increases thereby.

Fourth, to match a special configuration of a device, the PCB may usually be designed as a polygon; but most of the SMT equipments only allow a rectangular PCB. Thus, the rectangular PCB will be further sliced after the SMT process, wasting time and money. If the PCBs can be sliced in advance and arranged on a carrier to start the SMT process, money is saved and the manufacturing efficiency can be increased.

Furthermore, an effective process should have a carrier with a plurality of PCBs arranged with components in advance before a SMT process, and further has the PCBs assembled with double sides simultaneously. Orientation structures on the carrier thus must resist a high temperature in the reflow process. Although the heat-durable orientation structures can be manufactured, mass production thereof is difficult due to complexity and automation.

The descriptions mentioned above indicate a carrier adopted for a plurality of PCBs can save labor. The PCB can be a thin board or a flexible board.

A heat-resist adhesive of a new development that withstands high temperature and will not harden during the reflow process can be used with an auxiliary machine and provide an excellent advantage.

Hence, an improvement over the prior art is required to overcome the disadvantages thereof.

SUMMARY OF THE INVENTION

The primary object of the invention is therefore to specify an orientation equipment with multiple PCBs, which is used in surface mount technology (SMT) to provide a chip process for various high quality products.

According to the invention, the object is achieved by an orientation equipment with multiple PCBs, which is used in a surface mount technology (SMT) line. The orientation equipment includes a rack module. The rack module includes a casing mounted at a front of the SMT line, a visual orientation module having a visual orientation camera used for recognizing a configuration and a position of the PCB, a movable arm module capable of lateral, longitudinal, upward, downward, and partial rotational movement, an inhalation module arranged on the movable arm module and having a planar inhaling plate, and a conveyer module. The conveyer module includes a conveyer belt with an input, an output, an orientation side, and an adjustment side. The movable arm module is capable of carrying a plurality of PCBs for orientation on a carrier. The PCBs are transferred in from a first side of the conveyer module and the carrier is transferred in from a second side of the conveyer module. The visual orientation module, the movable arm module, the inhalation module and the conveyer module mechanically connect to the rack module in a direct and indirect manner, alternatively.

To provide a further understanding of the invention, the following detailed description illustrates embodiments and examples of the invention. Examples of the more important features of the invention thus have been summarized rather broadly in order that the detailed description thereof that follows may be better understood, and in order that the contributions to the art may be appreciated. There are, of course, additional features of the invention that will be described hereinafter and which will form the subject of the claims appended hereto.

BRIEF DESCRIPTION OF THE DRAWINGS

These and other features, aspects, and advantages of the present invention will become better understood with regard to the following description, appended claims, and accompanying drawings, where:

DETAILED DESCRIPTION OF PREFERRED EMBODIMENTS

A heat-resist adhesive connects PCBs and a carrier for passing through a single-sided SMT line, in which the heat-resist adhesive can be reused and manipulated easily because it does not harden. In additional, an auxiliary equipment can be provided to save labor and cost.

Figure 1:
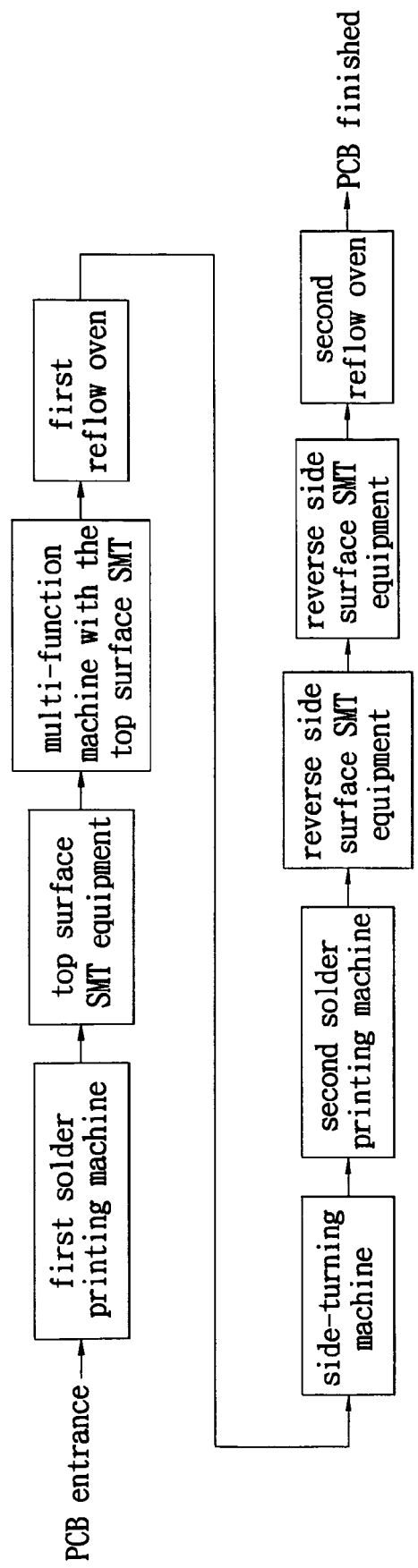
FIG. 1 is a flow chart of a conventional PCB assembly line.
Figure 2:
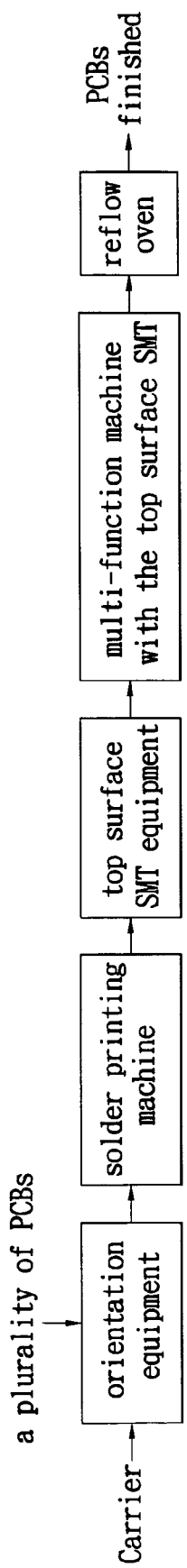
FIG. 2 is a flow chart of a PCB assembly line according to a preferred embodiment of the present invention.

FIG. 2 illustrates a SMT production line according to the present invention. After the heat resist adhesive is arranged on the carrier, an orientation equipment according to the present invention can be provided on the SMT production line. Thus, the SMT production line includes the orientation equipment, a solder printing machine, a front-surface, high-speed SMT equipment, a multi-function machine with the front-surface SMT machine, and a reflow oven, in sequence. The arrangement of the PCBs omits the side-turning machine mentioned in the prior art, the second solder printing machine and the second reflow oven. If the PCBs are the same type, the front face PCB and the reverse face PCB can be arranged simultaneously on the carrier in the same SMT production line. After the first time the front face PCB and the reverse face PCB are processed, the two PCBs can be exchanged with each other to repeat the process for a complete assembly.

Therefore, a distinguished characteristic can be referred to because a plurality of PCBs is processed simultaneously to save labor and costs. This is particularly true for a conventional PCB manufacturing that needs 24 hours to produce a batch.

Figure 3:
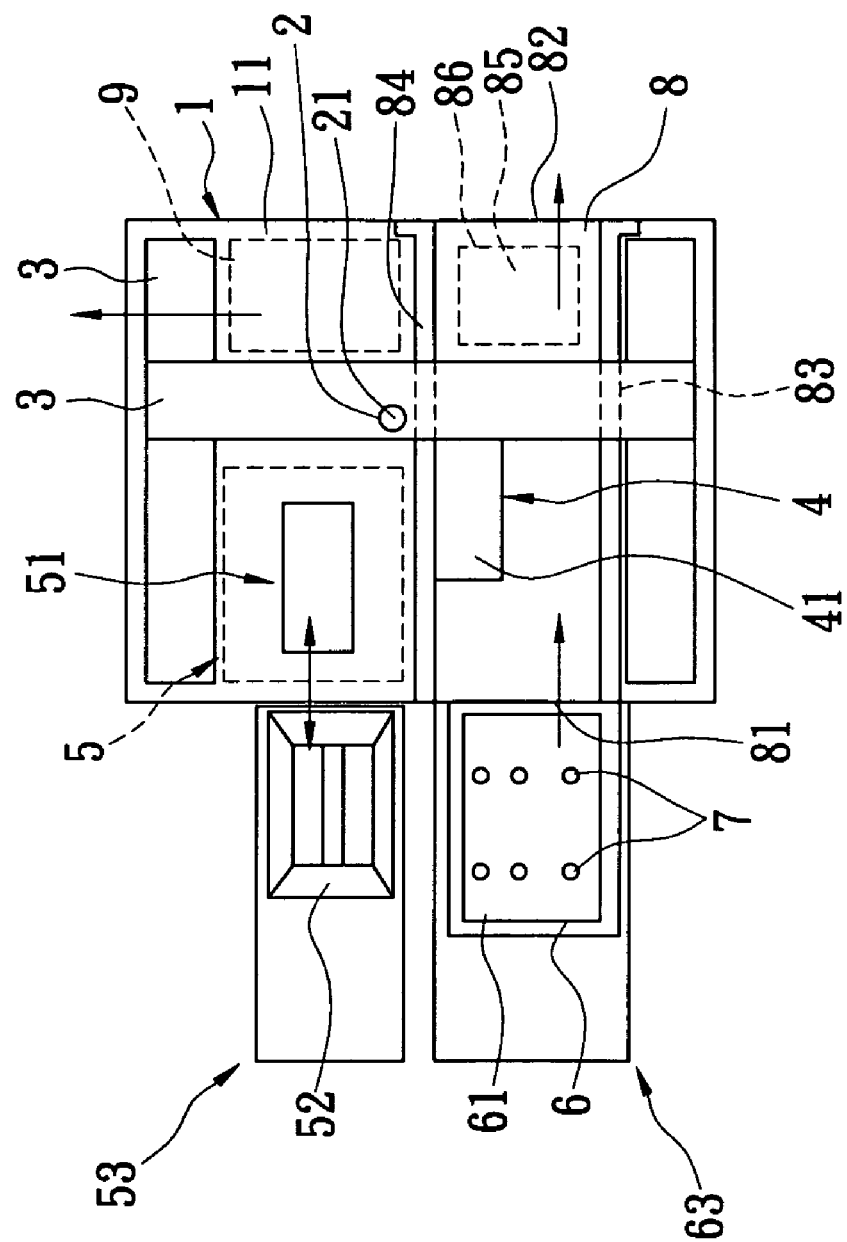
FIG. 3 is a perspective view of an orientation equipment according to the present invention.
Figure 4:
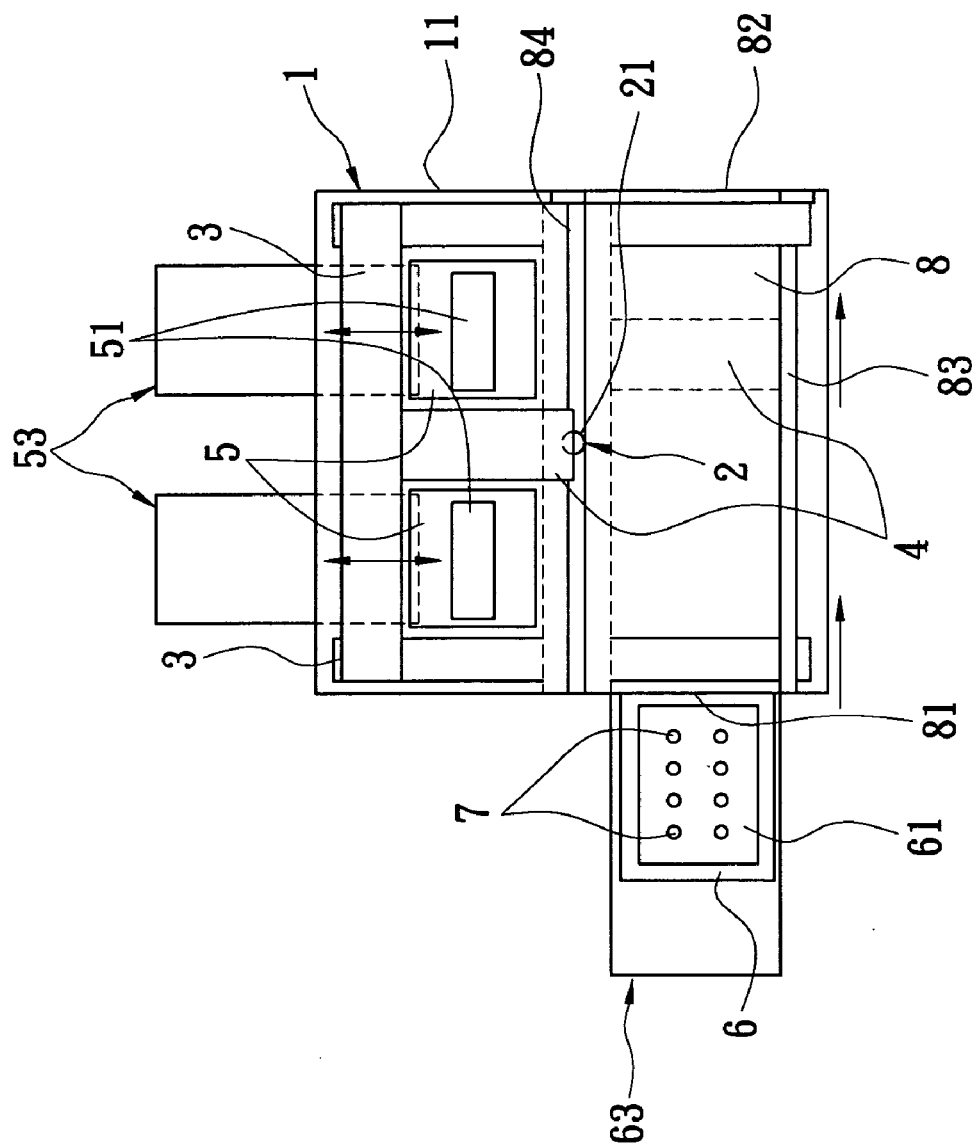
FIG. 4 is a perspective view of an orientation equipment of another embodiment according to the present invention.

FIGS. 3 and 4 illustrate the orientation equipment according to the present invention, which includes a rack module 1, a visual orientation module 2, a movable arm module 3, an inhalation module 4 and a conveyer module 8. The rack module 1 includes a casing 11 mounted at a front of the SMT line and has a plurality of components and modules disposed therein. The visual orientation module 2 has a circuit control system and a visual orientation camera 21 adopted for recognizing a configuration and a position of the PCB 51. The movable arm module 3 is capable of lateral, longitudinal, upward, downward, and partial rotational movement. In other words, the movable arm module 3 can be a conventional X-Y sliding structure plus a upward and downward swinging structure and an in-part rotating structure. The inhalation module 4 is arranged on the movable arm module 2, and has a vacuum control module and a planar inhaling plate 41 providing a vacuum inhalation. The planar inhaling plate 41 can be changed for various sizes.

Figure 5:
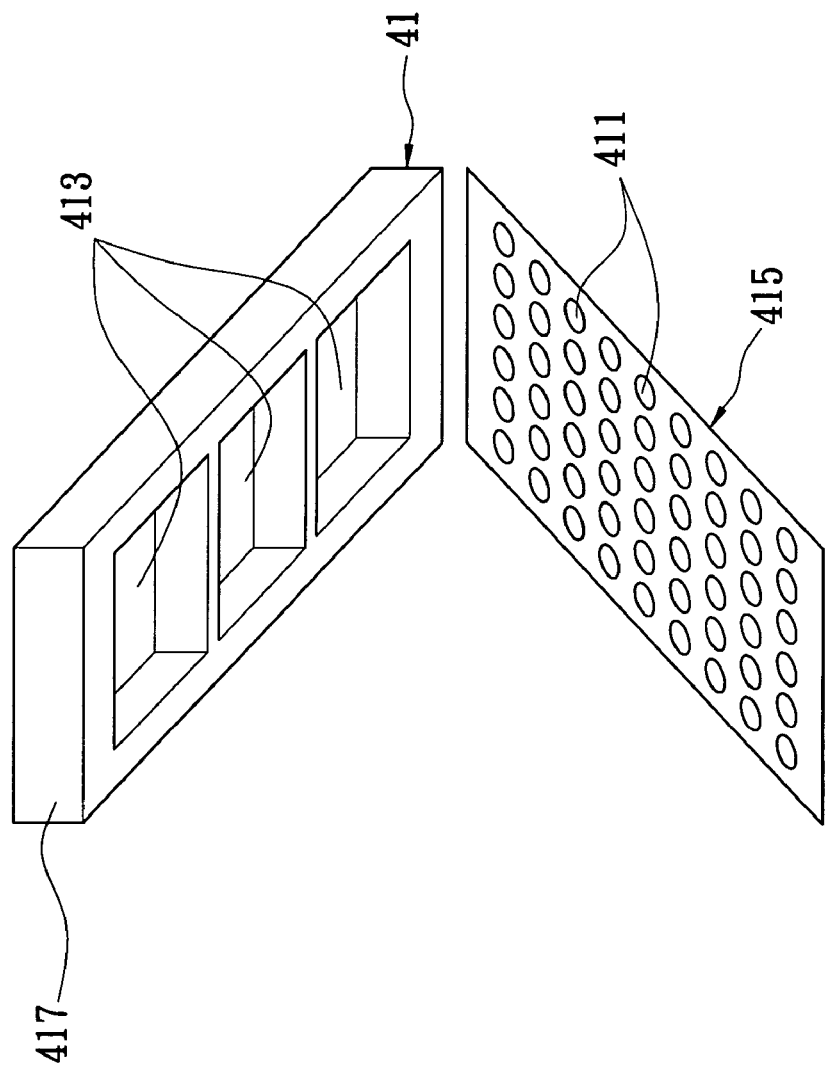
FIG. 5 is a perspective view of an inhaling plate of another embodiment according to the present invention.

With respect to FIG. 5, the conveyer module 8 includes a conveyer belt to support a carrier 61, and the conveyer belt has an input 81, an output 82, an orientation side 83 and an adjustment side 84. The movable arm module 3 is capable of carrying a plurality of PCBs 51 for orientation on the carrier 61. The PCBs 51 are transferred in from a first side of the conveyer module 8 and the carrier 61 is transferred in from a second side of the conveyer module 8. The visual orientation module 2, the movable arm module 3, the inhalation module 3 and the conveyer module 8 mechanically connect to the rack module 1 in a direct and indirect manner, alternatively Generally speaking, the movable arm module 3 and the inhalation module 4 carry the carrier 61 on the conveyer module 8, and further carry the PCBs 51 sequentially in predetermined positions 7 of the carrier 61, arranged with heat-resist adhesives. The PCBs 51 can be transferred into the SMT process thereby.

There are three procedures according to the present invention. First, when the PCB is a single-sided PCB (in FIG. 3), the carrier 61 can be transferred to the conveyer module 8 via a carrier-feeding module 6. The single-face PCBs 51 can be stacked beneath a PCB-feeding module 5. Until the single-face PCBs 51 is stacked to a predetermined level, a possible interference mechanism may be draw back therefrom. The movable arm module 3 and the inhalation module 4 suck the single-face PCB 51 upwards. After the visual orientation camera 21 recognizes the configuration and the position of-the single-face PCB 51, and the visual orientation module 2 counts the shift and rotation errors of the single-face PCB 51. The movable arm module 3 rotates and moves to compensate for the errors, and further carries the single-face PCB 5 over the carrier 61 and waits. After the carrier 61 descends, the movable arm module 3 lowers the inhalation module 4 to put the single-face PCB 51 on the carrier 61, and further carries a plurality of the single-face PCBs 51 in the predetermined positions 7, arranged with heat-resist adhesives in advance. The conveyer module 8 then moves the carrier 61 and the single-face PCBs 51 to a compression area 85 thereof. A compression plate 86 descends to press the single-face PCBs 51 onto the carrier 61. The compression plate 75 rises and the carrier 61 is transferred to a next station via the conveyer module 7 in the SMT production line.

Second, the PCB 51 is a double-sided PCB, and the carrier 61 moves as described in reference to the first procedure (in FIG. 3). Each double-sided PCB 51 is arranged on a tray 51, the tray is further arranged on a magazine, and the magazine is further arranged on the PCB-feeding module 5. The tray 52 (in FIG. 6) and the double-sided PCBs 51 are transferred to the predetermined position on the orientation equipment. The movable arm module 3 and the inhalation module 4 suck a respective double-sided PCB 51 prior to the steps mentioned above. The tray 52 is drawn back to the magazine via the conveyer belt or others, and the magazine automatically rises a level to prepare a next tray.

Third, whether the PCB is a single-face PCB or a double-sided PCB, the PCB 51 is provided by the PCB-feeding module 5. The single-face PCB is arranged on the magazine directly and the double-sided PCB is arranged on the magazine via the tray 52.

FIG. 3 further shows one type of PCBs and FIG. 4 further shows two types of PCBs. The carrier 61 in FIG. 3 supports two PCBs of the same type with a front surface and a reverse surface, respectively. One PCB with the front surface can be provided by the PCB-feeding module 5 for direct placement on the carrier 61. The other PCB with the reverse surface can be provided after flapping for placement on the carrier 61. The flapping step of the other PCB with reverse surface can be finished by a conventional flapping module. The carrier 61 in FIG. 4 includes a plurality of inventory inputs in the PCB-feeding module 5, the movable arm module 3 and the inhalation module 4 can arrange the different types PCBs on the carrier 61.

The PCB-feeding module 5 includes a PCB feeder 53, and a tray 52 that can support and deliver the PCB 51 (along an arrow in FIGS. 3 and 4). The orientation equipment further has an ejection module 9 (referred to by an upward arrow in FIG. 3). The carrier-feeding module 6 includes a carrier feeder 63 to practice a rightward transfer in FIG. 3. The arrows in FIG. 3 and 4 represent delivery directions between the modules via a conveyer or others, respectively. According to this embodiment, the quantity of the conveyer belts may be 3 to 4.

If the visual orientation module 2 cannot recognize the PCB due to the deformation of the material or the pollution of an orientation point thereof, the movable arm module 3 moves to a rejected part area "A" located at the eject module 9. The inhalation module 4 is lowered to release the vacuum to put a rejected product onto the rejected part area "A", and the conveyer belt supporting the rejected product moves a predetermined distance to avoid an overlap with the next rejected product, so that the rejected product can be removed without stopping the equipment.

Further embodiments according to the present invention include the visual orientation camera 21 being a charge-coupled device (CCD), or a contract image sensor (CIS). The heat-resist adhesive is made of silicon, toluene and resin materials. The movable arm module 3 includes a lateral sliding lever capable of lateral movement and a longitudinal sliding lever capable of longitudinal movement. The carrier 61 includes an orientation line for orientating the PCBs and the carrier 61 has two PCBs of the same type arranged thereon; one is front surface up and the other is reverse surface up. The PCB-feeding module 5 is arranged on the adjustment side of the conveyer belt to feed the PCBs, and the carrier-feeding module 6 is arranged on the input of the conveyer belt to feed the carrier 61.

In embodiment according to the present invention in FIG. 5, the planar inhalation plate 41 has three cavities 413 formed thereon and a vacuum hole 411 to suck the PCBs 51, so as to suck various sizes PCBs 51. The planar inhalation plate 41 comprises a thin steel plate 415 and a cavity wall 417 conencting to each other.

Figure 6:
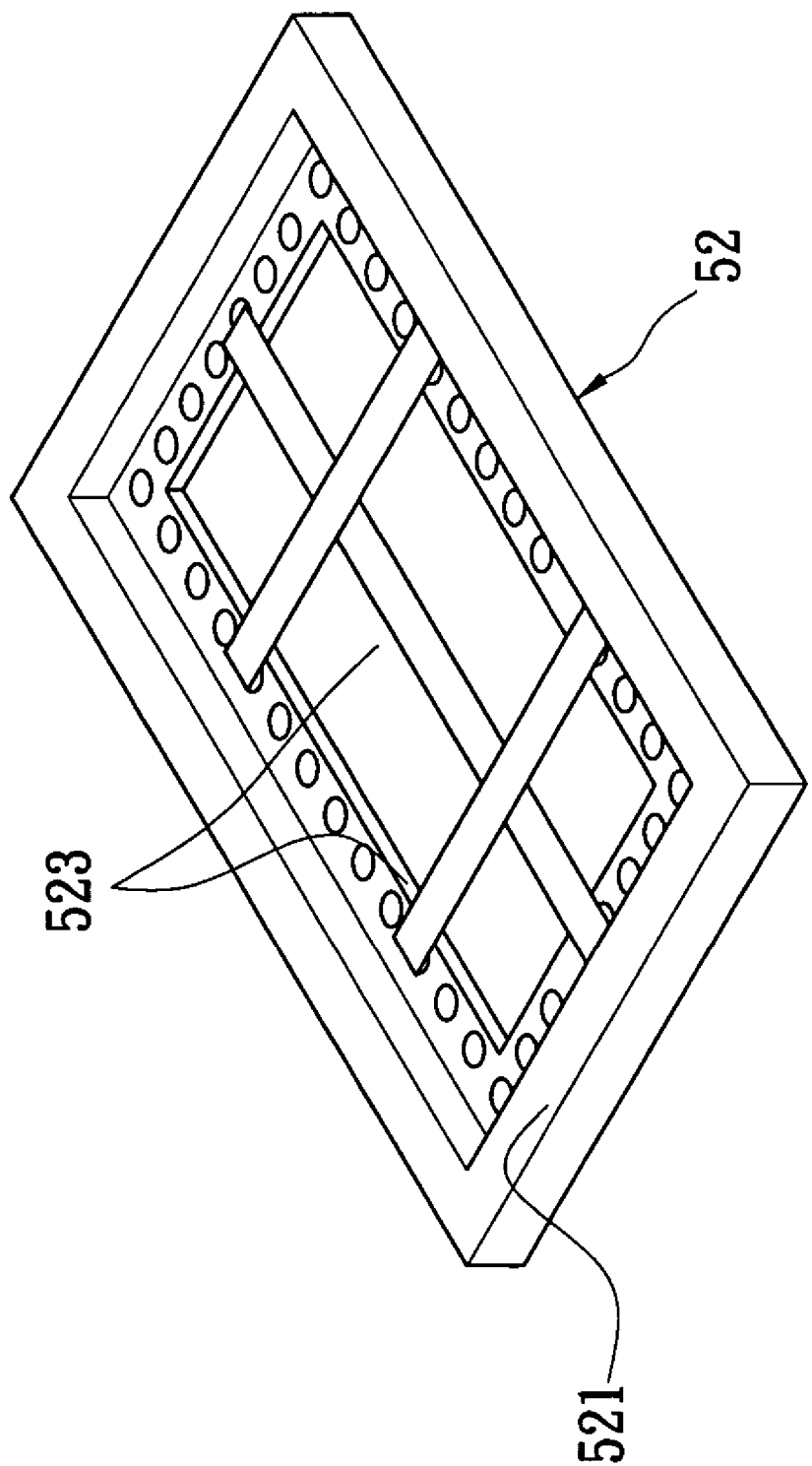
FIG. 6 is a perspective view of a tray according to the present invention.

In addition, FIG. 6 shows the tray 52 having a through hole formed on a bottom thereof to mate with the double-sided PCBs, so as to prevent interference. The tray 52 defines a strip orientation area 521 and has an orientation strip 523 disposed in the strip orientation area 521 in order to avoid contact between a body of the tray 52 and the double-sided PCB.

There are some adventures according to the present invention:
1. Quantities of PCBs can be processed simultaneously to save labor and to increase manufacturing efficiency.
2. A SMT production line that can deal with various kinds and sizes PCBs can save time and increase manufacturing efficiency.
3. The simplified process can save labor.
4. Omission of other machines reduces power consumption.
5. Various kinds and sizes of PCB production are easy to schedule.

It should be apparent to those skilled in the art that the above description is only illustrative of specific embodiments and examples of the invention. The invention should therefore cover various modifications and variations made to the herein-described structure and operations of the invention, provided they fall within the scope of the invention as defined in the following appended claims.

What is claimed is:

1. An orientation equipment apparatus for combined relative orientation of multiple printed circuit boards (PCBs), used in a surface mount technology (SMT) line, the orientation equipment comprising:
   a rack module including a casing mounted in a front of the SMT line;
   a carrier for shared transport of a plurality of PCBs placed therein for processing downstream in the SMT line;
   a visual orientation module having a visual orientation camera used for recognizing a configuration and a position of each PCB to be placed in the carrier;
   a movable arm module capable of lateral, longitudinal, upward, downward, and partial rotational movement, the movable arm module being operable to place a plurality of PCBs in selectively arranged manner on the carrier;
   an inhalation module arranged on the movable arm module and having a planar inhaling plate; and
   a conveyer module including a conveyer belt with an input, an output, an orientation side, and an adjustment side;
   wherein the PCBs are transferred in from a first side of the conveyer module and the carrier is transferred in from a second side of the conveyer module; and
   wherein the visual orientation module, the movable arm module, the inhalation module and the conveyer module mechanically connect to the rack module in a direct and indirect manner, alternatively.

2. The orientation equipment as claimed in claim 1, wherein the carrier is arranged on a predetermined position with a heat-resist adhesive for orientating the PCBs.

3. The orientation equipment as claimed in claim 1, wherein the visual orientation camera is a charge-coupled device (CCD), or a contact image sensor (CIS).

4. The orientation equipment as claimed in claim 2, wherein the heat-resist adhesive is made of silicon, toluene and resin materials.

5. The orientation equipment as claimed in claim 1, wherein the movable arm module includes a lateral sliding lever capable of lateral movement and a longitudinal sliding lever capable of longitudinal movement.

6. The orientation equipment as claimed in claim 1, wherein the planar inhaling plate provides a vacuum inhalation.

7. The orientation equipment as claimed in claim 1, wherein the carrier includes an orientation line for orientating the PCBs.

8. The orientation equipment as claimed in claim 1, wherein the carrier has two, same-type PCBs arranged thereon, one with a front surface thereof facing up and another with a reverse surface thereof facing up.

9. The orientation equipment as claimed in claim 1, further including a PCB-feeding module and a carrier-feeding module.

10. The orientation equipment as claimed in claim 9, wherein the PCB-feeding module is arranged on the adjustment side of the conveyer belt to feed the PCBs, and the carrier-feeding module is arranged on the input of the conveyer belt to feed the carrier.

11. The orientation equipment as claimed in claim 9, wherein the PCB-feeding module includes a plurality of inventory inputs.

12. The orientation equipment as claimed in claim 9, wherein the PCB-feeding module includes a tray comprising a through hole formed in a bottom thereof to mate with double-sided PCBs.

13. An orientation equipment apparatus for combined relative orientation of multiple printed circuit boards (PCBs), the orientation equipment comprising:
- a PCB-feeding module for introducing a plurality of PCBs;
- a carrier for shared transport of a plurality of PCBs placed therein for processing downstream;
- a movable arm module being operable to place a plurality of PCBs from the PCB-feeding module in selectively arranged manner on the carrier;
- an inhalation module arranged on the movable arm module for releasable attachment to each of the PCBs being placed on the carrier;
- a conveyer module for transferring the a carrier from an input position to an output position; and
- a visual orientation module having a visual orientation camera used for recognizing a configuration and a position of each PCB to be placed by the movable arm module on the carrier.

14. The orientation equipment as claimed in claim 13, wherein the carrier includes a plurality of predetermined positions having heat-resist adhesive for securing the orientations of the PCBs arranged therein.

15. The orientation equipment as claimed in claim 13, wherein the visual orientation camera includes a charge-coupled device (CCD), or a contact image sensor (CIS).

16. The orientation equipment as claimed in claim 13, wherein the movable arm module includes a lateral sliding lever capable of lateral movement and a longitudinal sliding lever capable of longitudinal movement.

17. The orientation equipment as claimed in claim 13, wherein the carrier includes an orientation line for orientating the PCBs.

18. The orientation equipment as claimed in claim 13, further including a carrier-feeding module.

19. The orientation equipment as claimed in claim 13, wherein the PCB-feeding module includes a tray comprising a through hole formed in a bottom thereof to mate with double-sided PCBs.

20. The orientation equipment as claimed in claim 13, wherein a conveyer module includes a conveyer belt, the carrier being transferred on the conveyer belt.

* * * * *